(12) United States Patent
Jung et al.

(10) Patent No.: US 9,543,485 B2
(45) Date of Patent: Jan. 10, 2017

(54) LIGHT EMITTING DEVICE (71) Applicant: LG INNOTEK CO., LTD., Seoul (KR)

(72) Inventors: Sung Ho Jung, Seoul (KR); Youn Joon Sung, Seoul (KR); Hyun Don Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/504,522

(22) Filed: Oct. 2, 2014

(65) Prior Publication Data
US 2015/0091037 A1 Apr. 2, 2015

(30) Foreign Application Priority Data
Oct. 2, 2013 (KR) .......................... 10-2013-0118177

(51) Int. Cl.
| | |
|---|---|
| *H01L 33/44* | (2010.01) |
| *H01L 33/58* | (2010.01) |
| *H01L 33/40* | (2010.01) |
| *H01L 33/42* | (2010.01) |
| *H01L 33/22* | (2010.01) |

(52) U.S. Cl.
CPC .............. *H01L 33/58* (2013.01); *H01L 33/22* (2013.01); *H01L 33/405* (2013.01); *H01L 33/42* (2013.01); *H01L 33/44* (2013.01); *H01L 2224/48091* (2013.01)

(58) Field of Classification Search
CPC .................................. H01L 33/44; H01L 33/58
See application file for complete search history.

(56) References Cited

U.S. PATENT DOCUMENTS

| | | | | |
|---|---|---|---|---|
| 2002/0039001 A1* | 4/2002 | Nagai | ................. | H01L 25/0753 313/512 |
| 2004/0211969 A1* | 10/2004 | Ishizaki | .................. | H01L 33/44 257/94 |
| 2006/0145170 A1* | 7/2006 | Cho | ........................ | H01L 33/22 257/95 |

(Continued)

FOREIGN PATENT DOCUMENTS

EP 2 202 811 A1 6/2010

OTHER PUBLICATIONS

European Search Report dated Feb. 17, 2015 issued in Application No. 14186309.2.

*Primary Examiner* — Yu Chen
(74) *Attorney, Agent, or Firm* — KED & Associates, LLP (57) ABSTRACT

A light emitting device includes a semiconductor structure layer including a first conductive semiconductor layer, an active layer on the first conductive semiconductor layer, and a second conductive semiconductor layer on the active layer. A plurality of lower refractive layers is provided on an outer surface of the semiconductor structure layer. The lower refractive layers includes a first lower refractive layer having a first refractive index lower than a refractive index of the semiconductor structure layer on a surface of the semiconductor structure layer, and a second lower refractive layer having a second refractive index lower than the first refractive index on an outer surface of the first lower refractive layer. The second refractive index of the second lower refractive layer is 1.5 or less, and the second lower refractive layer is provided on an outer surface thereof with a plurality of protrusions. The second lower refractive layer includes a plurality of metallic oxide powders.

15 Claims, 6 Drawing Sheets

(56) References Cited

U.S. PATENT DOCUMENTS

| | | | |
|---|---|---|---|
| 2006/0154392 A1 | 7/2006 | Tran et al. | |
| 2007/0080361 A1* | 4/2007 | Malm | B82Y 20/00 |
| | | | 257/99 |
| 2008/0128732 A1* | 6/2008 | Haruna | H01L 33/44 |
| | | | 257/98 |
| 2008/0296602 A1 | 12/2008 | Liu | |
| 2009/0052159 A1* | 2/2009 | Abe | B82Y 20/00 |
| | | | 362/84 |
| 2009/0152582 A1* | 6/2009 | Chang | H01L 33/507 |
| | | | 257/98 |
| 2010/0163903 A1 | 7/2010 | Shim | |
| 2010/0308357 A1* | 12/2010 | Horie | H01L 33/44 |
| | | | 257/98 |
| 2011/0062479 A1* | 3/2011 | Sugano | H01L 33/0095 |
| | | | 257/98 |
| 2013/0207074 A1 | 8/2013 | Lee et al. | |

\* cited by examiner

LIGHT EMITTING DEVICE

CROSS-REFERENCE TO RELATED APPLICATION

This application claims priority under 35 U.S.C. §119 to Korean Application No. 10-2013-0118177 filed on Oct. 2, 2013, whose entire disclosure is hereby incorporated by reference.

BACKGROUND

1. Field

The embodiment relates to a light emitting device, a method of fabricating the light emitting device, a light emitting device package, and a lighting system.

2. Background

A light emitting device (LED) is a device having a characteristic of converting electrical energy into light energy. For example, the LED may represent various colors by adjusting the compositional ratio of compound semiconductors.

A LED according to the related art includes an N type GaN layer on a sapphire substrate, a multiple quantum well structure including an InGaN quantum well and a GaN quantum barrier, and a P type GaN layer, and emits light as electrons supplied from the N type GaN layer are combined with electrons supplied from the P type GaN layer in an active layer.

Although internal quantum efficiency of the LED approximates 100%, external quantum efficiency is only in the range of 2% to 30% since the total internal reflection, which is a physical phenomenon caused by a great difference in refractive index between a semiconductor and the air, prevents light, which is emitted from the active layer in the LED, from being extracted to the outside For example, since a compound semiconductor, such as GaP or GaAs, has a refractive index of about 3.5 or 3.6, and the air has a refractive index of 1, a critical angle allowing the light emitted from the active layer to exit to the outside is about 16°. In the case of a GaN-based semiconductor device, since the refractive index of GaN is about 2.5, and the refractive index of the air is 1, the critical angle is about 23°. In other words, the light emitted from the active layer may exit to the air only if an incident angle of light onto a top surface of the active layer is less than 16° or 23°.

Accordingly, there are suggested schemes of highly transmitting photons to the external air by artificially making the surface of a semiconductor layer rough in order to improve external extraction efficiency of the photons.

BRIEF DESCRIPTION OF THE DRAWINGS

The embodiments will be described in detail with reference to the following drawings in which like reference numerals refer to like elements wherein.

DETAILED DESCRIPTION

Light Emitting Device

Figure 1:
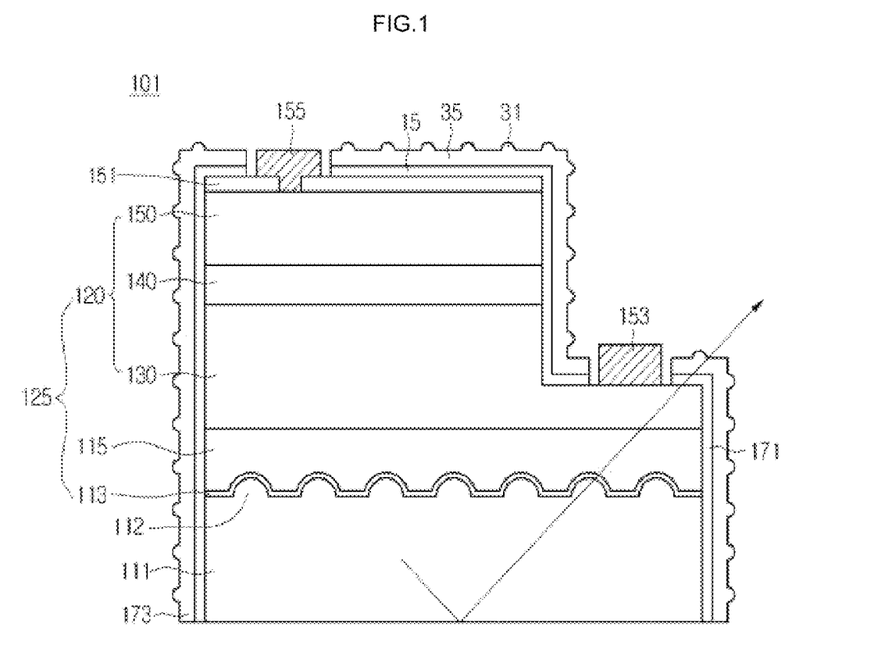
FIG. 1 is a sectional view showing a light emitting device according to the first embodiment.
Figure 2:
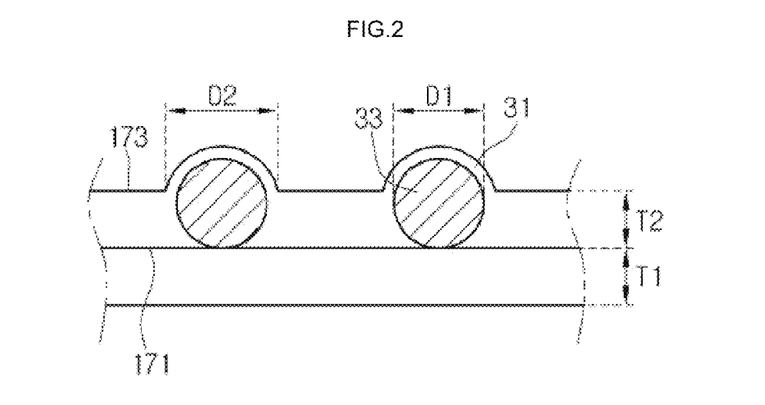
FIG. 2 is an enlarged view partially showing first and second refractive layers of the light emitting device shown in FIG. 1.

FIG. 1 is a sectional view showing a light emitting device 101 according to the first embodiment. FIG. 2 is an enlarged view partially showing a first lower refractive layer and a second lower refractive layer of the light emitting device shown in FIG. 1. The light emitting device 101 according to the embodiment includes a substrate 111, a semiconductor structure layer 125 having a plurality of compound semiconductor layers on the substrate 111, a first lower refractive layer 171 having a first refractive index on the surface of the semiconductor structure layer 125, and a second lower refractive layer 173 having a second refractive index lower than the first refractive index on the surface of the first lower refractive layer 171 and having a plurality of protrusions 31 protruding from the surface of the first lower refractive layer 171.

The semiconductor structure layer 125 may include a material selected from among group II to VI compound semiconductors, for example at least one of a group II-VI compound semiconductor and a group III-V compound semiconductor. The compound semiconductor includes at least one of compound semiconductors, such as, GaN, InN, AlN, InGaN, AlGaN, InAlGaN, AlInN, AlGaAs, GaP, GaAs, GaAsP, and AlGaInP.

For example, the semiconductor structure layer 125 includes a buffer layer 113 disposed on the substrate 111, a lower conductive layer 115 disposed on the buffer layer 113, and a light emitting structure 120 disposed on the lower conductive layer 115.

For example, the substrate 111 may include a transmissive substrate, a conductive substrate, or an insulating substrate. For example, the substrate 111 may include at least one of sapphire ($Al_2O_3$), SiC, Si, GaAs, GaN, ZnO, GaP, InP, and Ge. A plurality of protrusion parts 112 may be disposed on a top surface of the substrate 111. The protrusion parts 112 may be disposed through an etching process for the substrate 111 or may be disposed in an additional roughness form. Each protrusion part 112 may have a stripe shape, a hemispherical shape, or a dome shape. The substrate 111 may have a thickness in the range of 30 μm to 300 μm but the embodiment is not limited thereto. The protrusion part 112 may be removed, but the embodiment is not limited thereto.

The semiconductor structure layer 125 disposed by laminating a plurality of compound semiconductor layers may be grown on the substrate 111. The growth equipment for the compound semiconductor layers may be electronic beam depositor, physical vapor deposition (PVD), chemical vapor deposition (CVD), or plasma laser deposition (PLD) equipment, a dual-type thermal evaporator, sputtering equipment, or metal organic chemical vapor deposition (MOCVD) equipment, but the embodiment is not limited thereto.

The buffer layer 113 may be disposed of at least one layer on the substrate 111 by using a group II to VI compound semiconductor. The buffer layer 113 includes a semiconductor layer by using a group III-V compound semiconductors. For example, the buffer layer 113 has a composition formula of $In_xAl_yGa_{1-x-y}N$ ($0 \le x \le 1$, $0 \le y \le 1$, and $0 \le x+y \le 1$) or includes at least one of compound semiconductors, such as GaN, InN, AlN, InGaN, AlGaN, InAlGaN, AlInN, AlGaAs, GaP, GaAs, GaAsP, and AlGaInP. The buffer layer 113 may have a superlattice structure disposed by alternately arranging mutually different semiconductor layers. The buffer layer 113 may be disposed to reduce a lattice constant difference between the substrate 111 and a nitride-based semiconductor, and may be defined as a defect control layer. The lattice constant of the buffer layer 113 may have a value between a lattice constant of the substrate 111 and the lattice constant of the nitride-based semiconductor. The buffer layer 113 may include an oxide such as a ZnO layer, but the embodiment is not limited thereto. The buffer layer 113 may a size in the range 10 nm to 500 nm, or may not be formed.

The lower conductive layer 115 is disposed with electrical conductivity lower than that of an undoped semiconductor, for example a first conductive semiconductor layer 130 on the buffer layer 113. The lower conductive layer 115 may be realized by using a GaN-based semiconductor including group II to VI compound semiconductors, for example a group III-V compound semiconductor. The undoped semiconductor layer may include N type dopants even if the undoped semiconductor layer is intentionally not doped with the N type dopants. The undoped semiconductor layer may not be formed, and the embodiment is not limited thereto.

The light emitting structure 120 includes the first conductive semiconductor layer 130, an active layer 140 disposed on the first conductive semiconductor layer 130, and a second conductive semiconductor layer 150 disposed on the active layer. In addition, another layer may be additionally disposed between the first conductive semiconductor layer 130 and the active layer and/or between the active layer 130 and the second conductive semiconductor layer 150, but the embodiment is not limited thereto.

The first conductive semiconductor layer 130 may be disposed between the lower conductive layer 115 and the active layer 140. The first conductive semiconductor layer 130 may be realized by using at least one of group III-V and II-VI compound semiconductors doped with first conductive dopants. For example, the first conductive semiconductor layer 130 may include a semiconductor material having a composition formula of $In_xAl_yGa_{1-x-y}N$ ($0 \le x \le 1$, $0 \le y \le 1$, and $0 \le x+y \le 1$). If the first conductive semiconductor layer 130 is an N type semiconductor layer, the first conductive dopants include Si, Ge, Sn, Se, and Te serving as n-type dopants. The first conductive semiconductor layer 130 includes at least one of compound semiconductors such as GaN, InN, AlN, InGaN, AlGaN, InAlGaN, AlInN, AlGaAs, GaP, GaAs, GaAsP, and AlGaInP. The first conductive semiconductor layer 130 may include a single layer or multiple layers. If the first conductive semiconductor layer 130 includes the multiple layers, the first conductive semiconductor layer 130 may include mutually different materials or mutually different dopant concentrations.

At least one of the lower conductive layer 115 and the first conductive semiconductor layer 130 may have a superlattice structure disposed by alternately providing at least two layers different from each other, and each layer in the superlattice structure may be formed at a thickness of several Å or more.

The active layer 140 may include at least one of a single well structure, a single quantum well structure, a multiple-quantum well structure, a quantum-wire structure, or a quantum dot structure. The active layer 140 may be disposed by repeatedly arranging quantum well and barrier layers twice or 30 times. The quantum barrier layer may be formed of a semiconductor having bandgap wider than that of the quantum well layer. The quantum well and barrier layers may be formed of group II to VI compound semiconductors. The quantum well and barrier layers may be formed the same semiconductor or semiconductors different from each other. The active layer 140 may emit at least one peak wavelength selected in the range of an ultraviolet wavelength band to a visible wavelength band, but the embodiment is not limited thereto.

An electron blocking layer may be disposed between the active layer 140 and the second conductive semiconductor layer 150. The electron blocking layer may be formed of a P type semiconductor layer. The bandgap of the electron blocking layer may be wider than that of the active layer 140.

According to another embodiment, the first conductive semiconductor layer 130 may be realized by using a P type semiconductor layer, and the second conductive semiconductor layer 150 may be realized by using an N type semiconductor, but the embodiment is not limited thereto. A semiconductor of a type different from that of the second conductive semiconductor layer 150, for example an N type semiconductor layer (not shown) or a P type semiconductor layer may be additionally disposed on the second conductive semiconductor layer 150. Therefore, the light emitting structure 120 may be realized in one structure among an N-P junction structure, a P-N junction structure, an N-P-N junction structure, and a P-N-P junction structure. The embodiment provides a light emitting device having the light emitting structure, a method of fabricating the light emitting device, a light emitting device package, and a lighting system.

An electrode layer 151 is disposed on the light emitting structure 120, and serves as a transparent electrode layer or a current spreading layer. The electrode layer 151 may be disposed between a second electrode 155 and a portion of the second conductive semiconductor layer 150. The electrode layer 151 may be formed of a transmissive material or a conductive material. For example, the electrode layer 151 may be formed of a material having a refractive index lower than that of a nitride semiconductor. For example, the electrode layer 151 may have a refractive index of 2.0 to 2.1. The electrode layer 151 may be formed of a transmissive material, for example a transmissive material to transmit at least 70% of light. For example, the electrode layer 151 may be formed of metal, a metallic oxide, or a metallic nitride. The electrode layer 151 may be formed of one selected from among ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO nitride), ZnO, IrOx, RuOx, NiO, Al, Ag, Pd, Rh, Pt, and Ir.

The first electrode 153 is disposed on the first conductive semiconductor layer 130, and the first electrode 153 is electrically connected with the first conductive semiconductor layer 130. The second electrode 155 is disposed on the electrode layer 151, and electrically connected with the second conductive semiconductor layer 150 and the electrode layer 151. At least one hole (not shown) may be disposed in the electrode layer 151, and a portion of the second electrode 155 may make contact with the second conductive semiconductor layer 150 through the hole. The second electrode 155 may make contact with the electrode layer 151 and the second conductive semiconductor layer 150, but the embodiment is not limited thereto.

The first electrode 153 and the second electrode 155 may include a current spreading pattern having an arm structure or a finger structure. The first and second electrodes 153 and 155 may include metal having the ohmic-contact, an adhesive layer, or a bonding layer, but the embodiment is not limited thereto. The first and second electrodes 153 and 155 may include one selected from among Ti, Ru, Rh, Ir, Mg, Zn, Al, In, Ta, Pd, Co, Ni, Si, Ge, Ag, and Au, and a selective alloy thereof.

If the semiconductor structure layer 125 is formed of a nitride semiconductor, the refractive index may be in the range of about 2.45 to 2.5. If the semiconductor structure layer 125 is formed of a compound semiconductor such as GaP or GaAs, the refractive index may be in the range of 3.5 to 3.6. The semiconductor materials have the refractive indexes of 2.4 or more. In addition, if the substrate 111 is a sapphire substrate, the refractive index may be in the range of 1.75 to 1.76. If the substrate 111 is a GaN substrate and a GaAs substrate, the refractive index may be 2.4 or more. If the electrode layer 151 includes a transparent material such as ITO, the refractive index may be in the range of 2.0 to 2.1. The light emitted from the active layer 140 is emitted in all directions, in which the light is emitted through the semiconductor structure layer 125, the substrate 111, and the electrode layer 151. In this case, if air exists at an outside of the light emitting device 101, light extraction efficiency may be degraded due to the difference in refractive index between the air and the semiconductor structure layer 125.

According to the embodiment, in order to improve external extraction efficiency of photons, a lower refractive layer having a multi-layer structure may be disposed on the surface of the semiconductor structure layer 125. The lower refractive layer having the multi-layer structure may be formed of at least two layers or three layers. For example, the refractive layer having the multi-layer structure may include first and second lower refractive layers 171 and 173 on the surface of the semiconductor structure layer 125. The first lower refractive layer 171 is disposed on a surface of the semiconductor structure layer 125. The first lower refractive layer 171 may be formed of a material having a first refractive index higher than a second refractive index of the second lower refractive layer 173 and lower than the refractive index of the semiconductor structure layer 125. The first lower refractive layer 171 may be formed of materials having transmissive and insulating properties. For example, the first lower refractive layer 171 may have the refractive index in the range of 1.5 to 2.0. If the first lower refractive layer 171 is formed of a material having the first refractive index, for example a refractive index in the range of about 1.7 to 2.0, the first lower refractive layer 171 includes at least one of a hafnium oxide, a zirconium oxide, and a magnesium oxide. The hafnium oxide includes $HfO_2$ having the refractive index of about 1.9, the zirconium oxide includes $ZrO_2$ having the refractive index of 2.0, and the magnesium oxide includes MgO having the refractive index of 1.7.

The second lower refractive layer 173 may be formed of a material different from a material constituting the first lower refractive layer 171. For example, the second lower refractive layer 173 may be formed of a material having a refractive index making a difference of 0.01 from the first refractive index of the first lower refractive layer 171.

For example, the second lower refractive layer 173 may be formed of a material having the second refractive index in the range of 1.4 to 1.5. The second lower refractive layer 173 may be formed through the fabrication method based on a spin on dielectric layer. The second lower refractive layer 173 may include one of silicate, siloxane, hydrogen silsesquioxane (HSQ), methyl silsesquioxane (MQS), MQS+HSQ, perhydropolysilazane, and polysilanzene.

As shown in FIGS. 1 and 2, the second lower refractive layer 173 may include metallic oxide powders 33, and the metallic oxide powders 33 include a material having the refractive index of 1.5 or less. The metallic oxide powder 33 may have a width of 100 nm or more, for example a width of 500 nm or more. The metallic oxide powder 33 may include the same material as that of the second lower refractive layer 173, or may include a material having a refractive index lower than that of the second lower refractive layer 173. The metallic oxide powder 33 may be formed of a material having a refractive index making a difference of 0.01 to 0.1 from a refractive index of the second lower refractive layer 173. The metallic oxide powder 33 may include a material having a refractive index of 1.49 or less, for example a silica material. The silica material has a refractive index of about 1.45.

The metallic oxide powder 33 forms the protrusions 31 on the surface of the second lower refractive layer 173. The protrusion 31 allows the second lower refractive layer 173 to have a concavo-convex surface, an unevenness surface, or a roughness surface. Since the roughness surface is formed by the protrusions 31 of the second lower refractive layer 173, the critical angle of incident light is changed, so that the light extraction efficiency can be improved. The rough surface may include a convex surface and a concave surface by the metallic oxide powder 33. The protrusions 31 may protrude toward an outer surface of the second lower refractive layer 173. The protrusions 31 may be spaced apart from the outer surface of the second lower refractive layer 173. The protrusion 31 may make contact with or be spaced apart from an inner surface of the second lower refractive layer 173. The protrusions 31 may make contact with the outer surface of the first lower refractive layer 171. For example, when the protrusions 31 make contact with a boundary surface between the first and second lower refractive layers 171 and 173, the light extraction efficiency can be improved due to a refractive index difference at the boundary surface.

The second lower refractive layer 173 is formed after coating the first lower refractive layer 171. The process of forming the second lower refractive layer 173 after coating the first lower refractive layer 171 may be performed by performing a curing process after coating an insulating material including the mixture of the metallic oxide powder 33.

The first lower refractive layer 171 is disposed on a surface of the substrate 111 and a surface of the semiconductor structure layer 125. A first region 15 of the first lower refractive layer 171 extends on the surface of the electrode layer 151 to improve the light extraction efficiency and to improve the adhesive strength with the electrode layer 151. The second lower refractive layer 173 is disposed on the surface of the first lower refractive layer 171 to protect the first lower refractive layer 171. A first region 35 of the second lower refractive layer 173 extends on the first region 15 of the first lower refractive layer 171 to improve the adhesive strength. In addition, the first region 35 of the second lower refractive layer 173 may be disposed or make contact with the electrode layer 151. The second lower refractive layer 173 may protect the outer surface and the lateral surface of the first lower refractive layer 171.

The second lower refractive layer 173 has the second refractive index between the first refractive index of the first lower refractive layer 171 and a refractive index of the air, thereby refracting and transmitting light transmitted through the first lower refractive layer 171. Accordingly, the first and second lower refractive layers 171 and 173 having refractive indexes gradually reduced in a light extraction direction from the surface of the semiconductor structure layer 125 are disposed, so that the light extraction efficiency can be improved. The light emitted from the semiconductor structure layer 125 may be discharged through the electrode layer 151, the first lower refractive layer 171, and the second lower refractive layer 173. When a plurality of holes are disposed in the electrode layer 151, at least one of the first and second lower refractive layers 171 and 173 may be disposed in the holes.

The first and second lower refractive layers 171 and 173 may not make contact with the first and second electrodes 153 and 155, but the embodiment is not limited thereto. The first and second lower refractive layers 171 and 173 may not be disposed on the bottom surface of the substrate 111, and the embodiment is not limited thereto.

The first and second lower refractive layers 171 and 173 have first and second open regions. The first open region is disposed therein with the first electrode 153 and exposes a portion of the first electrode 153. The second open region is disposed therein with the second electrode 155 and exposes a portion of the second electrode 155.

FIG. 2 is an enlarged view partially showing the first and second lower refractive layer shown in FIG. 1. Referring to FIG. 2, the first lower refractive layer 171 may have a thickness T1 thicker than a thickness T2 of the second lower refractive layer 173. The thickness T1 of the first lower refractive layer 171 may be in the range of 300 nm to 700 nm. The second lower refractive layer 173 may have the thickness T2 in the range of 100 nm to 700 nm.

The protrusions 31 protruding further than a region of the outer surface of the second lower refractive layer 173 protrude out of the metallic oxide powders 33 contained in the second lower refractive layer 173. The protrusion 31 protruding out of the second lower refractive layer 173 has a width D2 wider than a width D1 of the metallic oxide powder 33, but the embodiment is not limited thereto. The width D1 of the metallic oxide powder 33 may be greater than or less than the thickness T2 of the second lower refractive layer 173. The metallic oxide powder 33 may have a circular shape, a polygonal shape, or an irregular shape. The intervals between the protrusions 31 may be irregularly formed, but the embodiment is not limited thereto. The D2 of the protrusion 31 may be in the range of 5 μm to 100 μm but the embodiment is not limited thereto.

Figure 3:
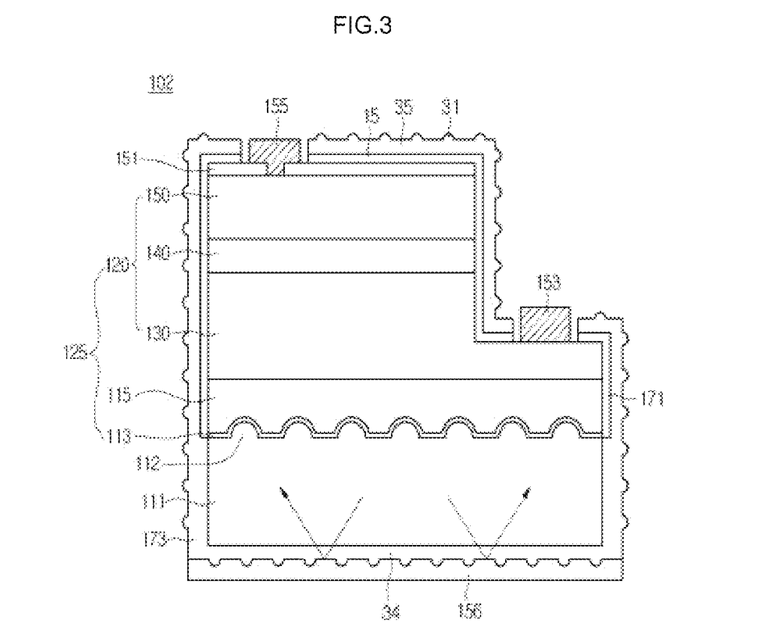
FIG. 3 is a side sectional view showing a light emitting device according to a second embodiment.

FIG. 3 is a side sectional view showing a light emitting device according to the second embodiment. In the following description made with reference to FIG. 3, the same components and structure as those of the description made with reference to FIGS. 1 and 2 can be understood by making reference to the description made with reference to FIGS. 1 and 2.

A light emitting device 102 includes a substrate 111, a semiconductor structure layer 125 having a plurality of compound semiconductor layers disposed on the substrate 111, an electrode layer 151, a reflective layer 156 under the substrate 111, a first lower refractive layer 171 having a first refractive index on the surface of the semiconductor structure layer 125, and a second lower refractive layer 173 having a plurality of protrusions 31 protruding out of the first lower refractive layer 171 and having the second refractive index less than the first refractive index.

The electrode layer 151 is formed on a second conductive semiconductor layer 150 of a light emitting structure 120 and formed of a transparent material. A first electrode 153 may be disposed on the first conductive semiconductor layer 130 and a second electrode 155 may be disposed on the electrode layer 151. The second electrode 155 may make contact with the electrode layer 151 and the second conductive semiconductor layer 150, but the embodiment is not limited thereto.

The first lower refractive layer 171 is disposed on the surface of the semiconductor structure layer 125. Since the first region 15 of the first lower refractive layer 171 extends on the surface of the electrode layer 151, the adhesive strength of the electrode layer 151 can be enhanced. In this case, if the first lower refractive layer 171 has a refractive index higher than that of the substrate 111, the first lower refractive layer 171 may not be disposed on a lateral side and a bottom surface of the substrate 111. In other words, the first lower refractive layer 171 may not make contact with the lateral side and the bottom surface of the substrate 111.

The second lower refractive layer 173 may be disposed on the surface of the first lower refractive layer 171, and may have a rough surface having a plurality of protrusions 31 due to metallic oxide powders. The second lower refractive layer 173 may make contact with the lateral side and the bottom surface of the substrate 111, and may extract light incident to the second lower refractive layer 173 through the substrate 111.

The reflective layer 156 is disposed under the substrate 111 to reflect light incident thereto. A bottom part 34 of the second lower refractive layer 173 may be disposed between the reflective layer 156 and the substrate 111. The bottom part 34 may space the reflective layer 156 apart from the bottom surface of the substrate 111. The reflective layer 156 may include at least one selected from the group consisting of Ag, Ni, Al, Rh, Pd, Ir, Ru, Mg, Zn, Pt, Au, Hf, and the combination thereof.

An outer surface of the reflective layer 156 may make contact with the protrusions 31 of the second lower refractive layer 173. The outer surface of the reflective layer 156 may have a plurality of recesses that become concave patterns due to the protrusions 31. The recesses may change the critical angle of the reflected light. Since the protrusions 31 disposed on the bottom part 34 of the second lower refractive layer 173 protrude toward the reflective layer 156, the light extraction efficiency can be improved due to the reflective layer 156. The area of the bottom surface of the reflective layer 156 may be wider than the area of the bottom of the substrate 111. The area of the bottom surface of the reflective layer 156 may be equal to or wider than that of the bottom part 34 of the second lower refractive layer 173. The light transmitted through the substrate 111 can be effectively reflected due to the reflective layer 156.

The details of the materials, the refractive indexes, and the thicknesses of the first and second lower refractive layers 171 and 173 can be understood by making reference to the description of the first embodiment. Accordingly, the first and second lower refractive layers 171 and 173 having refractive indexes gradually reduced in a light extraction direction from the surface of the semiconductor structure layer 125 are disposed, so that the light extraction efficiency can be improved.

Figure 4:
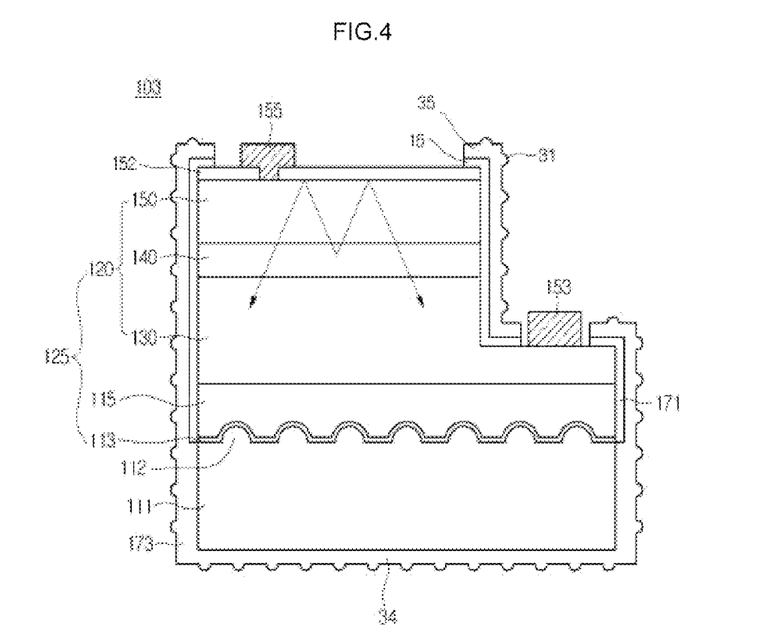
FIG. 4 is a side sectional view showing a light emitting device according to a third embodiment.

FIG. 4 is a side sectional view showing a light emitting device according to the third embodiment. In the following description made with respect to FIG. 4, the same components and structures as those described with reference to FIGS. 1 to 3 can be understood by making reference to the description made with reference to FIGS. 1 and 3.

Referring to FIG. 4, a light emitting device 103 includes a substrate 111, a semiconductor structure layer 125 having a plurality of compound semiconductor layers disposed on the substrate 111, an electrode layer 152 on the semiconductor structure layer 125, a first lower refractive layer 171 having a first refractive index on the surface of the semiconductor structure layer 125, and a second lower refractive layer 173 having a plurality of protrusions 31 protruding out of the first lower refractive layer 171 and having the second refractive index less than the first refractive index.

The electrode layer 152 is disposed on the second conductive semiconductor layer 150 of a light emitting structure 120. The electrode layer 152 may serve as a reflective electrode layer. For example, the electrode layer 152 may include at least one layer selected from the group consisting of Ag, Ni, Al, Rh, Pd, Ir, Ru, Mg, Zn, Pt, Au, Hf, and the combination thereof.

A first electrode 153 may be disposed on the first conductive semiconductor layer 130, and a second electrode 155 may be disposed on the electrode layer 152. The second electrode 155 may make contact with the electrode layer 152 and the second conductive semiconductor layer 150, but the embodiment is not limited thereto. The light emitting device 103 may be formed by rotating the structure shown in FIG. 3 by 180 degrees and mounting the structure in a flip chip scheme.

Since the first lower refractive layer 171 is disposed on the surface of the semiconductor structure layer 125, and a first region 15 extends on the top surface of the electrode layer 152, the adhesive strength of the electrode layer 152 can be enhanced. In this case, if the first lower refractive layer 171 has a refractive index higher than that of the substrate 111, the first lower refractive layer 171 may not be disposed a bottom surface of the substrate 111. In other words, the first lower refractive layer 171 may be spaced apart from the lateral side and the bottom surface of the substrate 111. A second open region of the first lower refractive layer 171 may have a width which is twice wider than that of the second electrode 155 or corresponds to at least 60%, in detail, at least 80% of the width of the electrode layer 152. The first regions 15 and 35 of the first and second lower refractive layers 171 and 173 may make contact with the second electrode 155, but the embodiment is not limited thereto. According to the embodiment, a resin material such as silicon or epoxy may be filled or a conductive bump may be disposed between the second electrode 55 and the first regions 15 and 35 of the first and second lower refractive layers 171 and 173, but the embodiment is not limited thereto.

The second lower refractive layer 173 is disposed on an outer surface of the first lower refractive layer 171, and may have a rough surface having a plurality of protrusions 31 disposed due to the metallic oxide powders. The second lower refractive layer 173 may make contact with the lateral side and the bottom surface of the substrate 111. Accordingly, the extraction efficiency of light incident to the second lower refractive layer 173 through the substrate 111 can be improved. A light extraction structure such as a concave-convex structure may be disposed on the bottom surface of the substrate 111, but the embodiment is not limited thereto.

The details of the materials, the refractive indexes, and the thicknesses of the first and second lower refractive layers 171 and 173 can be understood by making reference to the description of the first embodiment. Accordingly, the first and second lower refractive layers 171 and 173 having refractive indexes gradually reduced are disposed on the surface of the semiconductor structure layer 125, so that the light extraction efficiency can be improved. In addition, the surface roughness of the second lower refractive layer 173 can maximize the light extraction efficiency.

Figure 5:
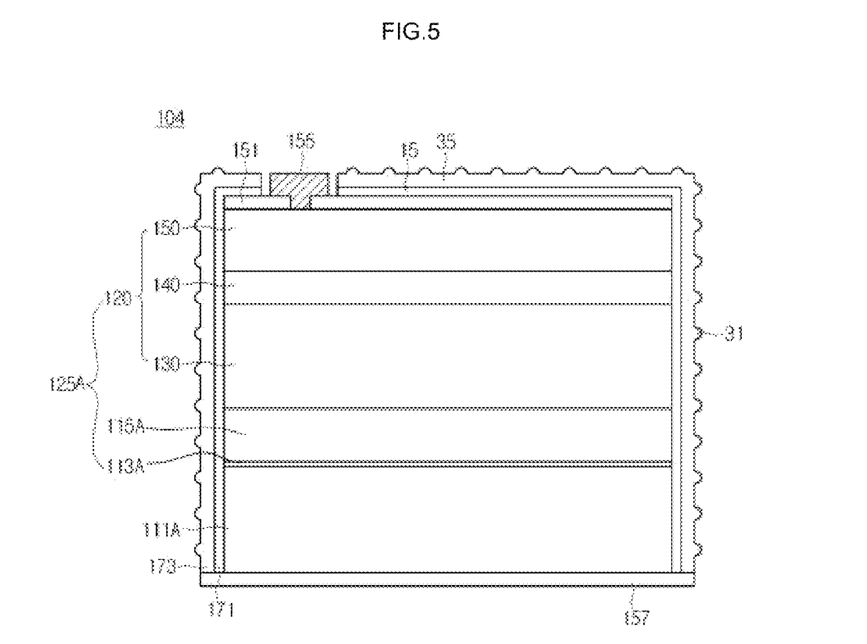
FIG. 5 is a side sectional view showing a light emitting device according to a fourth embodiment.

FIG. 5 is a side sectional view showing a light emitting device according to the fourth embodiment. In the following description made with respect to FIG. 5, the same components and structures as those described with reference to FIGS. 1 to 4 can be understood by making reference to the description made with reference to FIGS. 1 to 4.

Referring to FIG. 5, a light emitting device 104 according to the embodiment includes a conductive substrate 111A having dopants, a semiconductor structure layer 125A having a plurality of semiconductor layers 113A, 115A, and 120 on the substrate 111A, an electrode layer 151 on the semiconductor structure layer 125A, a second electrode 157 under the substrate 110A, a first lower refractive layer 171 having a first refractive index on the surface the substrate 111A and the semiconductor structure layer 125A, and a second lower refractive layer 173 having a plurality of protrusions protruding out of the first lower refractive layer 171 and having a second refractive index less than the first refractive index.

The substrate 111A may be disposed of transmissive and conductive materials. The substrate 111A may include the same dopants as that added in the first conductive semiconductor layer 130. For example, the substrate 111A includes n type dopants. The substrate 111A may include a semiconductor substrate including Si, GaN, SiC and GaAs.

A buffer layer 113A may be disposed between the substrate 111A and the light emitting structure 120. The buffer layer 113A may include conductive dopants, for example n type dopants. The buffer layer 113A may not be formed, but the embodiment is not limited thereto.

A superlattice layer 115A may be further disposed between the buffer layer 113A and the light emitting structure 120. The superlattice layer 115A is disposed by alternately arranging mutually different layers and includes n type dopants. For example, the superlattice layer 115A may be disposed by alternately at least two layers.

The semiconductor structure layer 125A may include the buffer layer 113A, the superlattice layer 115A, and the light emitting structure 120. The semiconductor structure layer 125A may further include a substrate if the substrate includes a semiconductor material.

A second electrode 157 is disposed under the substrate 111A. The second electrode 157 is disposed on an entire portion of the bottom of the substrate 111A and serves as a reflective layer and a bonding layer. The second electrode 157 may be used as a pad, and may be formed in a structure including at least one layer including a material selected from the group consisting of Ag, Ni, Al, Rh, Pd, Ir, Ru, Mg, Zn, Pt, Au, Hf, and the combination thereof.

The second electrode 157 extends under lower regions of the first and second lower refractive layers 171 and 173 to prevent light from leaking. In addition, the lower regions of the first and second lower refractive layers 171 and 173 make contact with the second electrode 157. Accordingly, the adhesive strength between first and second lower refractive layers 171 and 173 and the second electrode 157 can be improved. The second electrode 157 may have a width greater than that of the substrate 111A, so that light loss can be reduced.

The details of the materials, the refractive indexes, and the thicknesses of the first and second lower refractive layers 171 and 173 can be understood by making reference to the description of the first embodiment. Accordingly, the first and second lower refractive layers 171 and 173 having refractive indexes gradually reduced in a direction of outputting light are disposed on the surface of the semiconductor structure layer 125A, so that the light extraction efficiency can be improved. In addition, the second lower refractive layer 173 has a robustness surface, so that light extraction effect can be maximized.

Figure 6:
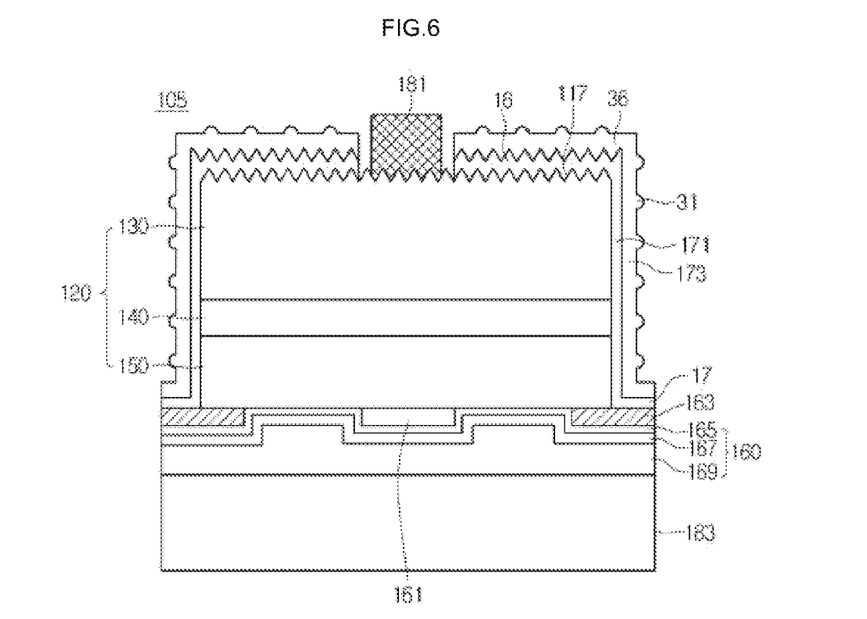
FIG. 6 is a side sectional view showing a light emitting device according to a fifth embodiment.

FIG. 6 is a side sectional view showing a light emitting device according to the fifth embodiment. In the following description made with respect to FIG. 6, the same components and structures as those described with reference to FIGS. 1 to 5 can be understood by making reference to the description made with reference to FIGS. 1 to 5.

Referring to FIG. 6, a light emitting device 105 includes a light emitting structure 120, a first electrode 181 on the light emitting structure 120, a second electrode 160 under the light emitting structure 120, a first lower refractive layer 171 having a first refractive index on the surface of the light emitting structure 120, a second lower refractive layer 173 having a plurality of protrusions 31 protruding out of the first lower refractive layer 171 and having a second refractive index less than a first refractive index, and a conductive support member 183 disposed under the second electrode 160.

The light emitting structure 120 includes a first conductive semiconductor layer 130, an active layer 140 under the first conductive semiconductor layer 130, and a second conductive semiconductor layer 150 under the active layer 140. The first conductive semiconductor layer 130 includes an n type semiconductor layer, and the second conductive semiconductor layer 140 includes a p type semiconductor layer.

The first electrode 181 is disposed on a top surface of the light emitting structure 120, for example a portion of the top surface of the first conductive semiconductor layer 130. The second electrode 160 is disposed on a bottom surface of the light emitting structure 120, for example a bottom surface of the second conductive semiconductor layer 150. The first electrode 181 and the second electrode 160 are disposed perpendicularly to the light emitting structure 120, thereby forming a vertical type electrode structure.

A light extraction structure 117 has a concavo-convex pattern on a top surface of the first conductive semiconductor layer 130. The light extraction structure 117 may be formed by performing an etching process with respect to the top surface of the first conductive semiconductor layer 130. The light extraction structure 117 changes a critical angle of incident light so that the light extraction efficiency can be improved. The first electrode 181 may have a rough bottom surface due to the light extraction structure 117. According to another embodiment, the light extraction structure 117 may not be disposed on the bottom surface of the first electrode 181, but the embodiment is not limited thereto.

The second electrode 160 is disposed under the second conductive semiconductor layer 150, and includes a contact layer 165, a reflective layer 167, and a bonding layer 169. The contact layer 165 may make contact with a semiconductor layer, for example a second conductive semiconductor layer 150. The contact layer 165 may include a lower conductive material, such as ITO, IZO, IZTO, IAZO, IGZO, IGTO, AZO, and ATO, or metal such as Ni or Ag. The reflective layer 167 is disposed under the contact layer 165, and the reflective layer 167 may have a structure including at least one layer including a material selected from the group consisting of Ag, Ni, Al, Rh, Pd, Ir, Ru, Mg, Zn, Pt, Au, Hf, and the combination thereof. The reflective layer 167 may partially make contact with a lower portion of the second conductive semiconductor layer 150, but the embodiment is not limited thereto.

A bonding layer 169 may be disposed under the reflective layer 167, and the bonding layer 169 may include barrier metal or bonding metal including at least one selected from the group consisting of Ti, Au, Sn, Ni, Cr, Ga, In, Bi, Cu, Ag, Ta, and the selective alloy thereof.

A current blocking layer 161 and a protective layer 163 are disposed at mutually different regions of a bottom surface of the light emitting structure 120. The current blocking layer 161 may include an insulating material. For example, the current blocking layer 161 may include at least one selected from among $SiO_2$, $SiO_x$, $SiO_xN_y$, $Si_3N_4$, $Al_2O_3$, and $TiO_2$. The current blocking layer 161 may include metal, for example metal for schottky contact. The current blocking layer 161 may include one current blocking layer or a plurality of blocking layers. The current blocking layer 161 may be overlapped with the first electrode 181 perpendicularly to the first electrode 181. The current blocking layer 161 may be disposed between the light emitting structure 120 and the second electrode 160. The current blocking layer 161 may have a width which is at most twice wider than the width of the first electrode 181. The current blocking layer 161 blocks current supplied from the second electrode 160 and diffuses the current to another region.

The protective layer 163 is disposed along an edge of a bottom surface of the second conductive semiconductor layer 150. The protective layer 163 may have a shape having an open inner part, for example a ring shape, a loop shape, or a frame shape. The protective layer 163 may include a transparent conductive material or a transparent insulating material. For example, the protective layer may include at least one of ITO, IZO, IZTO, IAZO, IGZO, IGTO, AZO, ATO, $SiO_2$, $SiO_x$, $SiO_xN_y$, $Si_3N_4$, $Al_2O_3$, and $TiO_2$. An inner side portion of the protective layer 163 is disposed under the second conductive semiconductor layer 150, and an outer side portion of the protective layer 163 is disposed outward of a lateral side of the light emitting structure 120. The protective layer 163 may be defined as a channel layer to protect an outer peripheral portion of the bottom surface of the light emitting structure 120.

A conductive support member 183 is disposed under the bonding layer 169. The conductive support member 183 may be formed of a conductive member, and may be formed of a conductive material, such as copper (Cu), gold (Au), nickel (Ni), molybdenum (Mo), Cu—W, or a carrier wafer such as Si, Ge, GaAs, ZnO, or SiC. According to another embodiment, the conductive support member 183 may be realized by a conductive sheet.

In this case, the substrate of FIG. 1 is removed. The substrate may be removed through a physical scheme such as laser lift off and/or a chemical scheme such as wet etching to expose the first conductive semiconductor layer 130. An isolation etching is performed in a direction of removing the substrate, so that the first electrode 181 is disposed on the first conductive semiconductor layer 130.

The first lower refractive layer 171 is disposed on the surface of the light emitting structure 120, and a first region 16 may be disposed on the top surface of the first conductive semiconductor layer 130. The first region 16 of the first lower refractive layer 171 may be formed in a concave-convex structure along a rough top surface of the first conductive semiconductor layer 130.

A second region 17 of the first lower refractive layer 171 extends along a top surface of the channel layer 163 while making contact with the top surface of the channel layer 163. The second region 17 of the first lower refractive layer 171 seals a region between the channel layer 163 and a lateral side of the second conductive semiconductor layer 150. Accordingly, moisture can be prevented from being infiltrated into an edge of the bottom surface of the second conductive semiconductor layer 150.

The second lower refractive layer 173 may be disposed on the surface of the first lower refractive layer 171, and have a rough surface having a plurality of protrusions 31 due to the metallic oxide powers. The second lower refractive layer 173 may improve light extraction efficiency. A first region 36 of the second lower refractive layer 173 is disposed on the first region 16 of the first lower refractive layer 171, and may have a concavo-convex bottom surface. The second region of the second lower refractive layer 173 extends to make contact with or cover the second region 17 of the first lower refractive layer 171. In addition, the second region of the second lower refractive layer 173 may extend while making contact with an outer lateral surface of the channel layer 163, but the embodiment is not limited thereto.

The first and second lower refractive layers 171 and 173 may have open regions, and the first electrode 181 may be disposed in the open region.

The details of the materials, the refractive indexes, and the thicknesses of the first and second lower refractive layers 171 and 173 can be understood by making reference to the description of the first embodiment. Accordingly, the first and second lower refractive layers 171 and 173 having refractive indexes gradually reduced are disposed on the surface of the light emitting structure 120, so that the light extraction efficiency can be improved. In addition, the surface roughness of the second lower refractive layer 173 can maximize light extraction efficiency.

Figure 7:
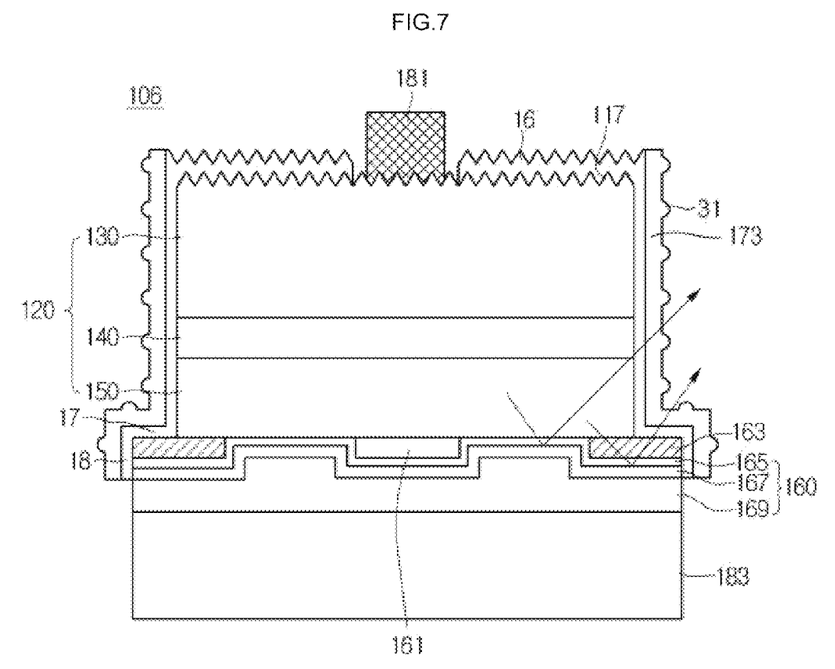
FIG. 7 is a side sectional view showing a light emitting device according to a sixth embodiment.

FIG. 7 is a side sectional view showing a light emitting device according to the sixth embodiment. In the following description made with respect to FIG. 6, the same components and structures as those described with reference to FIGS. 1 to 6 can be understood by making reference to the description made with reference to FIGS. 1 to 6.

Referring to FIG. 7, a light emitting device 106 includes a light emitting structure 120, a first electrode 181 on the light emitting structure 120, a second electrode 160 under the light emitting structure 120, a first lower refractive layer 171 having a first refractive index on a surface of the light emitting structure 120, a second lower refractive layer 173 having a plurality of protrusions 31 protruding out of the first lower refractive layer 171 and having the second refractive index less than the first refractive index, and a conductive support member 183 under the second electrode 160.

A light extraction structure 117 having a concavo-convex pattern is disposed on a top surface of the first conductive semiconductor layer 130. The light emitting structure 120 may be defined as a semiconductor structure layer.

The first lower refractive layer 171 may be disposed on the surface of the light emitting structure 120, and the first region 16 may extend on the top surface of the first conductive semiconductor layer 130. The first region 16 of the first lower refractive layer 171 may have a concavo-convex structure according to the light extraction structure of the first conductive semiconductor layer 130.

Second regions 17 and 18 of the first lower refractive layer 171 extend along a top surface and a lateral side of an outer portion of the channel layer 163. The second regions 17 and 18 make contact with a region between the channel layer 163 and a lateral side of the second conductive semiconductor layer 150, and a region between the channel layer 163 and the contact layer 165. Accordingly, the second regions 17 and 18 of the first lower refractive layer 171 can prevent moisture from being infiltrated through the bottom surface of the second lower refractive layer 150. In addition, the second region 18 of the first lower refractive layer 171 may extend to a lateral side of the reflective layer 169 of the second electrode 160. A portion of the second region 18 of the first lower refractive layer 171 is bonded to the top surface and the lateral side of the outer portion of the channel layer 163. The adhesive strength between the first lower refractive layer 171 and the channel layer 163 can be improved. The channel layer 163 has the thickness in the range of 1 µm to 2 µm but the embodiment is not limited thereto.

The second lower refractive layer 173 may be disposed on the surface of the first lower refractive layer 171, and may have a rough surface having a plurality of protrusions 31 due to metallic oxide powders. The second lower refractive layer 173 can improve light extraction efficiency. The second lower refractive layer 173 may not be formed in a region corresponding to the top surface of the first conductive semiconductor layer 130 or a region perpendicularly overlapped with the first in a region of the first lower refractive layer 171, but the embodiment is not limited thereto. The second lower refractive layer 173 may not be overlapped perpendicularly to the light emitting structure 120.

The details of the materials, the refractive indexes, and the thicknesses of the first and second lower refractive layers 171 and 173 can be understood by making reference to the description of the first embodiment. Accordingly, the first and second lower refractive layers 171 and 173 having refractive indexes gradually reduced in a light extraction direction from the surface of the light emitting structure 120 are disposed, so that the light extraction efficiency can be improved. In addition, the surface roughness of the second lower refractive layer 173 can maximize the light extraction efficiency.

The light emitting device according to the embodiment includes first and second lower refractive layers 171 and 173 disposed on the surface of the semiconductor structure layer having the light emitting structure. A resin material, such as silicon or epoxy, may be disposed on the surface of at least one of the first and second lower refractive layers 171 and 173, but the embodiment is not limited thereto. According to another embodiment, at least one of the first and second lower refractive layers 171 and 173 may make contact with a material having a refractive index equal to or lower than that of the second lower refractive layer 173. Accordingly, external quantum efficiency can be improved due to the first and second lower refractive layers 171 and 173.

<Light Emitting Device Package>

Figure 8:
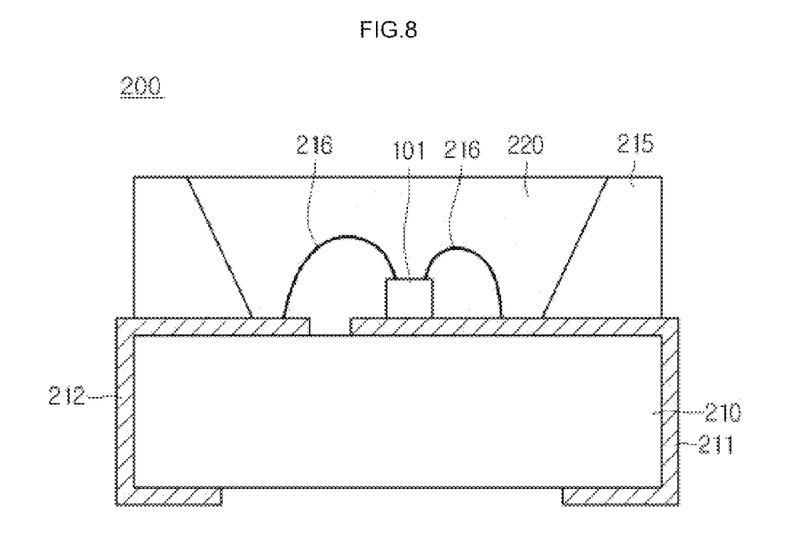
FIG. 8 is a sectional view showing a light emitting device package according to the embodiment.

FIG. 8 is a sectional view showing a light emitting device package having a light emitting device of FIG. 1, 3 or 4.

Referring to FIG. 8, a light emitting device package 200 a body 210, first and second lead electrodes 211 and 212 having at least a portion disposed in the body 210, a light emitting device 101 electrically connected to the first and second lead electrodes 211 and 212 on the body 210, and a molding member 220 disposed on the body 210 to cover the light emitting device 101 according to the embodiment.

The body 210 may include a silicon material, a synthetic resin material, or a metallic material. The body 210 includes a cavity disposed therein and a reflective part 215 having an inclined surface disposed at a peripheral portion thereof when viewed from the top.

The first and second lead electrodes 211 and 212 may be mutually isolated from each other and may pass through the body 210. In other words, a portion of the first and second lead electrodes 211 and 212 is disposed in the cavity, and the remaining portions of the first and second lead electrodes 211 and 212 may be disposed outside the body 210.

The first and second lead electrodes 211 and 212 may supply power to the light emitting device 101, reflect light emitted from the light emitting device 101 to increase the light efficiency, and discharge heat emitted from the light emitting device 101 to the outside.

The light emitting device 101 may be mounted on the body 210, or may be mounted on the first lead electrode 211 and/or the second lead electrode 212. The light emitting device 101 may be disposed in the form of at least one light emitting diode (LED). The LED chip may include a light emitting diode having a visible wavelength band of red, green, blue, or white light or a UV light emitting diode to emit ultraviolet (UV) light. A phosphor layer may be further disposed on the surface of the light emitting device 101, but the embodiment is not limited thereto.

A wire 216 connected to the light emitting device 101 may be electrically connected to at least one of the first and second lead electrodes 211 and 212, but the embodiment is not limited thereto. The light emitting device 101 may be connected to the first lead electrode 211 through the wire 216 or may be bonded onto the first lead electrode 211 so that the light emitting device 101 may be electrically connected to the first lead electrode 211, but the embodiment is not limited thereto.

The molding member 220 may surround the light emitting device 101 to protect the light emitting device 101. In addition, a phosphor is contained in the molding member 220, and the wavelength of light emitted from the light emitting device 101 may be changed by the phosphor. The molding member 220 may include a transmissive resin material such as silicon or epoxy. The molding member 220 may include a material having a refractive index equal to or lower than that of the first lower refractive layer.

A lens may be disposed on the molding member 220, but the embodiment is not limited thereto.

<Lighting System>

The light emitting device or the light emitting device package according to the embodiment is applicable to a lighting system. The lighting system includes a structure in which a plurality of light emitting devices are arrayed. The lighting system includes a display apparatus shown in FIGS. 9 and 10, a lighting apparatus shown in FIG. 11, a lighting lamp, a camera flash, a signal lamp, a headlamp for a vehicle, and an electronic display.

Figure 9:
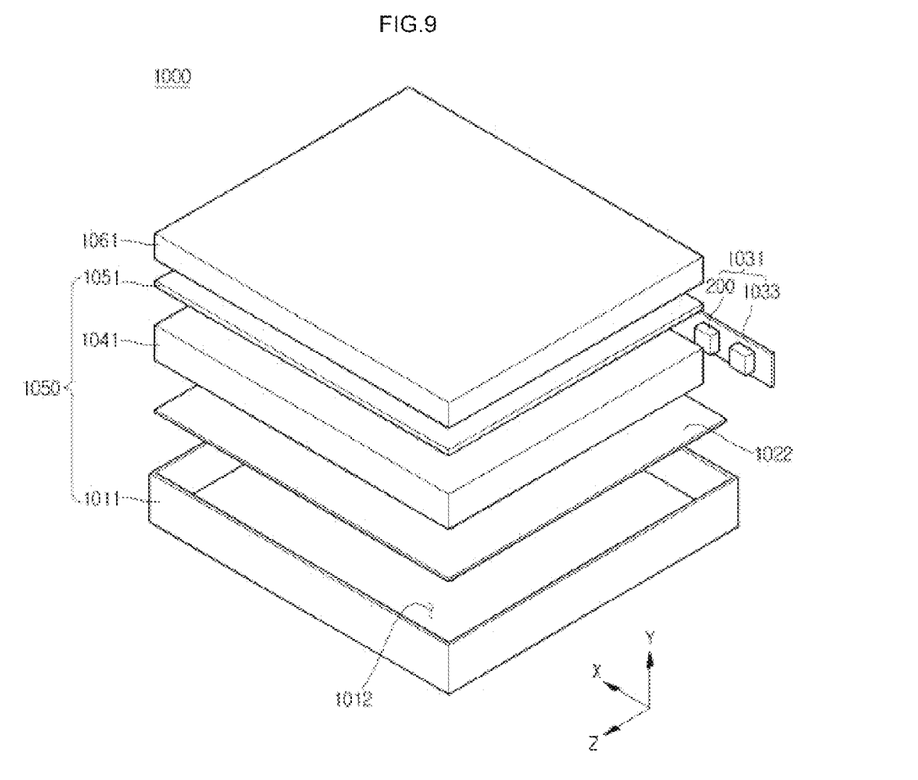
FIG. 9 is a perspective view showing a display apparatus having the light emitting device according to the embodiment.

FIG. 9 is an exploded perspective view showing a display apparatus having the light emitting device according to the embodiment.

Referring to FIG. 9, a display apparatus 1000 according to the embodiment includes a light guide plate 1041, a light emitting module 1031 to supply light to the light guide plate 1041, a reflective member 1022 under the light guide plate 1041, an optical sheet 1051 on the light guide plate 1041, a display panel 1061 on the optical sheet 1051, and a bottom cover 1011 to receive the light guide plate 1041, the light emitting module 1031, and the reflective member 1022, but the embodiment is not limited thereto.

The bottom cover 1011, the reflective sheet 1022, the light guide plate 1041, the optical sheet 1051, and the light unit 1050 may be defined as a backlight unit.

The light guide plate 1041 diffuses the light supplied from the light emitting module 1031 to provide surface light. The light guide plate 1041 may include a transparent material. For example, the light guide plate 1041 may include one of acryl-based resin, such as PMMA (polymethyl methacrylate), PET (polyethylene terephthalate), PC (polycarbonate), COO (cyclic olefin copolymer) and PEN (polyethylene naphthalate) resin.

The light emitting module 1031 is disposed on at least one side of the light guide plate 1041 to supply the light to at least one side of the light guide plate 1041. The light emitting module 1031 serves as the light source of the display device.

At least one light emitting module 1031 is disposed to directly or indirectly supply the light from one side of the light guide plate 1041. The light emitting module 1031 may include a board 1033 and the light emitting device according to the embodiments or the light emitting device package 200. The light emitting device or the light emitting device package 200 are arranged on the board 1033 while being spaced apart from each other at the predetermined interval.

The board 1033 may include a printed circuit board (PCB) including a circuit pattern (not shown). In addition, the board 1031 may also include a metal core PCB (MCPCB) or a flexible PCB (FPCB) as well as a resin-based PCB, but the embodiment is not limited thereto. If the light emitting device package 200 is installed on the side of the bottom cover 1011 or on a heat dissipation plate, the board 1033 may be omitted. The heat dissipation plate partially makes contact with the top surface of the bottom cover 1011.

In addition, the light emitting device package 200 are arranged such that light exit surfaces to discharge light of the light emitting device package 200 are spaced apart from the light guide plate 1041 by a predetermined distance on the board 1033, but the embodiment is not limited thereto. The light emitting device package 200 may directly or indirectly supply the light to a light incident surface, which is one side of the light guide plate 1041, but the embodiment is not limited thereto.

The reflective member 1022 is disposed below the light guide plate 1041. The reflective member 1022 reflects the light, which is traveled downward through the bottom surface of the light guide plate 1041, toward the display panel 1061, thereby improving the brightness of the light unit 1050. For example, the reflective member 1022 may include PET, PC or PVC resin, but the embodiment is not limited thereto. The reflective member 1022 may serve as the top surface of the bottom cover 1011, but the embodiment is not limited thereto.

The bottom cover 1011 may receive the light guide plate 1041, the light emitting module 1031, and the reflective member 1022 therein. To this end, the bottom cover 1011 has a receiving section 1012 having a box shape with an opened top surface, but the embodiment is not limited thereto. The bottom cover 1011 can be coupled with the top cover (not shown), but the embodiment is not limited thereto.

The bottom cover 1011 can be manufactured through a press process or an extrusion process by using metallic material or resin material. In addition, the bottom cover 1011 may include metal or non-metallic material having superior thermal conductivity, but the embodiment is not limited thereto.

The display panel 1061, for example, is an LCD panel including first and second transparent substrates, which are opposite to each other, and a liquid crystal layer disposed between the first and second substrates. A polarizing plate can be attached to at least one surface of the display panel 1061, but the embodiment is not limited thereto. The display panel 1061 displays information by allowing the light to pass therethrough. The display device 1000 can be applied to various portable terminals, monitors of notebook computers, monitors or laptop computers, and televisions.

The optical sheet 1051 is disposed between the display panel 1061 and the light guide plate 1041 and includes at least one transmissive sheet. For example, the optical sheet 1051 includes at least one selected from the group consisting of a diffusion sheet, a horizontal and vertical prism sheet, and a brightness enhanced sheet. The diffusion sheet diffuses the incident light, the horizontal and vertical prism sheet concentrates the incident light onto the display panel 1061, and the brightness enhanced sheet improves the brightness by reusing the lost light. In addition, a protective sheet can be disposed on the display panel 1061, but the embodiment is not limited thereto.

The light guide plate 1041 and the optical sheet 1051 can be disposed in the light path of the light emitting module 1031 as optical members, but the embodiment is not limited thereto.

Figure 10:
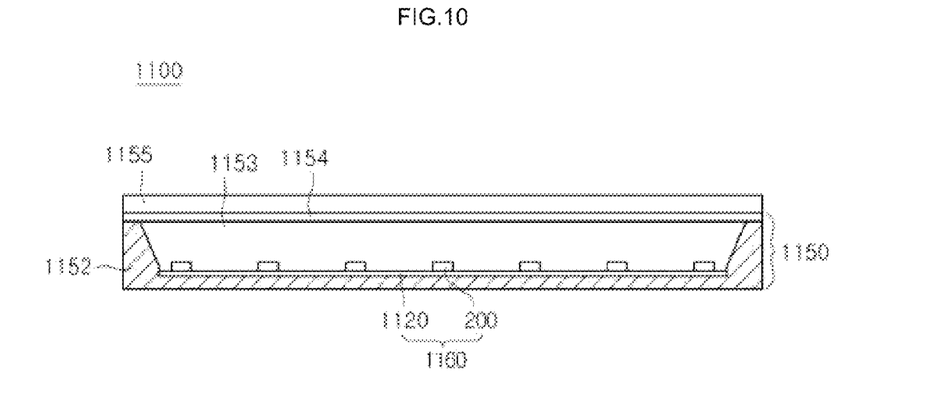
FIG. 10 is a sectional view showing a display apparatus having the light emitting device according to the embodiment.

FIG. 10 is a sectional view showing a display apparatus according to the embodiment.

Referring to FIG. 10, the display device 1100 includes a bottom cover 1152, a board 1120 on which the light emitting device package 200 are arrayed, an optical member 1154, and a display panel 1155.

The board 1120 and the light emitting device package 200 may constitute the light emitting module 1160. In addition, the bottom cover 1152, at least one light emitting module 1160, and the optical member 1154 may constitute the light unit 1150. The bottom cover 1152 can be disposed with a receiving section 1153, but the embodiment is not limited thereto. The light emitting module 1160 includes a board 1120, and a plurality of light emitting devices arranged on the board 1120 or a light emitting device package 200.

The optical member 1154 may include at least one selected from the group consisting of a lens, a light guide plate, a diffusion sheet, a horizontal and vertical prism sheet, and a brightness enhanced sheet. The light guide plate may include PC or PMMA (Poly methyl methacrylate). The light guide plate can be omitted. The diffusion sheet diffuses the incident light, the horizontal and vertical prism sheet concentrates the incident light onto a display region, and the brightness enhanced sheet improves the brightness by reusing the lost light.

The optical member 1154 is disposed above the light emitting module 1160 in order to convert the light emitted from the light emitting module 1160 into the surface light.

Figure 11:
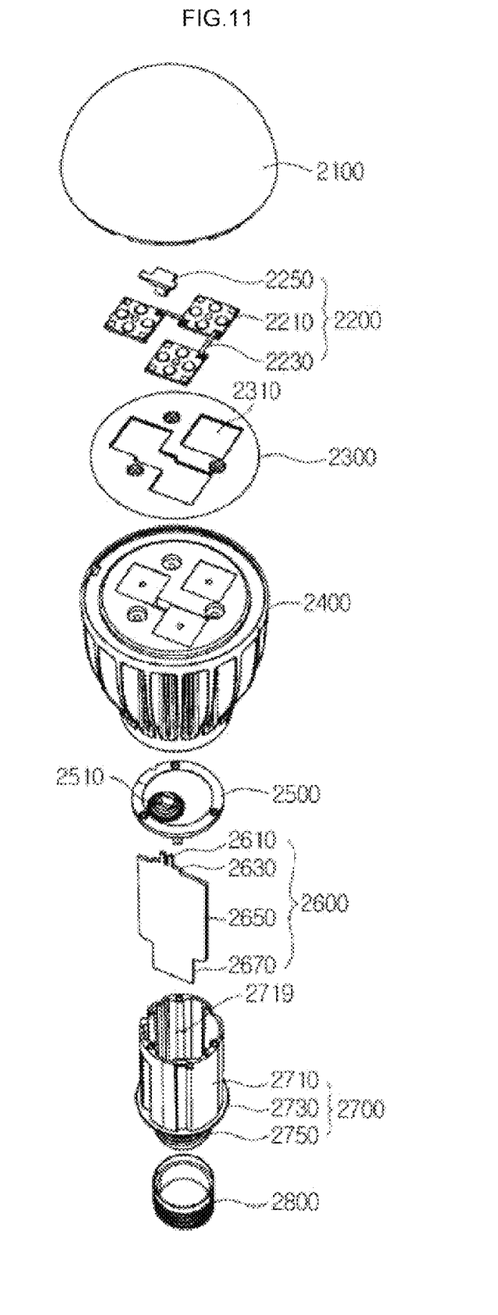
FIG. 11 is an exploded perspective view showing a lighting lamp having the light emitting device according to the embodiment.

FIG. 11 is an exploded perspective view showing a lighting device having the light emitting device according to the embodiment.

Referring to FIG. 11, the lighting device according to the embodiment may include a cover 2100, a light emitting module 2200, a heat radiation member 2400, a power supply part 2600, an inner case 2700, and a socket 2800. In addition, the light emitting device according to the embodiment may further include at least one of a member 2300 and a holder 2500. The light source module 2200 may include the light emitting device according to the embodiment.

For example, the cover 2100 has the shape of a bulb, or a hemispherical shape. The cover 2100 may have a hollow structure, and a portion of the cover 2100 may be open. The cover 2100 may be optically connected to the light source module 2200, and may be coupled with the heat radiation member 2400. The cover 2100 may have a recess part coupled with the heat radiation member 2400.

The inner surface of the cover 2100 may be coated with ivory white pigments serving as a diffusing agent. The light emitted from the light source module 2200 may be scattered or diffused by using the ivory white material, so that the light can be discharged to the outside.

The cover 2100 may include glass, plastic, PP, PE, or PC. In this case, the PC represents superior light resistance, superior heat resistance, and superior strength. The cover 2100 may be transparent so that the light source module 2200 may be recognized at the outside. In addition, the cover 2100 may be opaque. The cover 2100 may be formed through a blow molding scheme.

The light source module 2200 may be disposed at one surface of the heat radiation member 2400. Accordingly, the heat emitted from the light source module 2200 is conducted to the heat radiation member 2400. The light source module 2200 may include a light emitting device 2210, a connection plate 2230, and a connector 2250.

The member 2300 is disposed on the top surface of the heat radiation member 2400, and has a guide groove 2310 having a plurality of light emitting devices 2210 and a connector 2250 inserted into the guide groove 2310. The guide groove 2310 corresponds to the substrate of the light emitting device 2210 and the connector 2250.

White pigments may be applied to or coated on the surface of the member 2300. The member 2300 reflects light, which reflected by the inner surface of the cover 2100 to return to the light source module 2200, toward the cover 2100. Accordingly, the light efficiency of the lighting apparatus according to the embodiment can be improved.

The member 2300 may include an insulating material. The connection plate 2230 of the light source module 2200 may include an electric-conductive material. Accordingly, the heat radiation member 2400 may be electrically connected to the connection plate 2230. The member 2300 includes an insulating material to prevent the electrical short between the connection plate 2230 and the heat radiation member 2400. The heat radiation member 2400 receives heat from the light source module 2200 and the heat from the power supply part 2600 and radiates the heats.

The holder 2500 blocks a receiving groove 2719 of an insulating part 2710 disposed in an internal case 2700. Accordingly, the power supply part 2600 received in the insulating part 2710 of the internal case 2700 is sealed. The holder 2500 has a guide protrusion part 2510. The guide protrusion part 2510 may include a hole allowing a protrusion part 2610 of the power supply part 2600 to pass therethrough.

The power supply part 2600 processes and transforms an electrical signal received from the outside and supplies the electrical signal to the light source module 2200. The power supply part 2600 is received in the receiving groove 2719 of the internal case 2700, and sealed in the internal case 2700 by the holder 2500.

The power supply part 2600 may include a protrusion part 2610, a guide part 2630, a base 2650, and an extension part 2670.

The guide part 2630 protrudes outward from one side of the base 2650. The guide part 2630 may be inserted into the holder 2500. A plurality of parts may be disposed on one surface of the base 2650. For example, the parts include a DC converter, a driving chip to drive the light source module 2220, and an ESD (electrostatic discharge) protective device to protect the light source module 2200, but the embodiment is not limited thereto.

The extension part 2670 protrudes outward from another side of the base 2650. The extension part 2670 is inserted into the connection part 2750 of the internal case 2700, and receives an electrical signal from the outside. For example, the extension part 2670 may be equal to or less than the width of the connection part 2750 of the internal case 2700. The extension part 2670 may be electrically connected to the socket 2800 through a wire.

The internal case 2700 may be disposed therein with a molding part together with the power supply part 2600. The molding part is formed by hardening a molding liquid, so that the power supply part 2600 may be fixed into the internal case 2700.

According to the embodiment, the external quantum efficiency of the light emitting device can be improved. According to the embodiment, the surface of the semiconductor layer of the light emitting device can be protected. In addition, the embodiment can provide a light emitting device having improved optical reliability, a method of fabricating the light emitting device, a light emitting device package, and a lighting system.

The embodiment provides a light emitting device having improved external quantum efficiency.

The embodiment provides a light emitting device having a plurality of lower refractive layers having gradually-reduced refractive indexes on the surface of a semiconductor layer.

The embodiment provides a light emitting device having a first lower refractive layer having a first refractive index lower than that of a semiconductor layer on the surface of the semiconductor layer, and a second lower refractive layer having roughness disposed on the surface of the first lower refractive layer and having a second refractive index lower than the first refractive index.

The embodiment provides improved light extraction efficiency by a semiconductor layer of a light emitting device and a second lower refractive layer having roughness on the surface of a substrate.

The embodiment provides a light emitting device having highly improved external quantum efficiency, a method of fabricating the light emitting device, a light emitting device package, and a lighting system.

The embodiment provides a light emitting device having improved electrical reliability, a method of fabricating the light emitting device, a light emitting device package, and a lighting system.

According to the embodiment, there is provided a light emitting device including a semiconductor structure layer including a first conductive semiconductor layer, an active layer on the first conductive semiconductor layer, and a second conductive semiconductor layer disposed on the active layer, and a plurality of lower refractive layers disposed on an outer surface of the semiconductor structure layer. The plurality of lower refractive layers includes a first lower refractive layer having a first refractive index lower than a refractive index of the semiconductor structure layer on a surface of the semiconductor structure layer; and a second lower refractive layer having a second refractive index lower than the first refractive index on an outer surface of the first lower refractive layer, the second refractive index of the second lower refractive layer is 1.5 or less, the second lower refractive layer is disposed on an outer surface thereof with a plurality of protrusions, and the second lower refractive layer includes a plurality of metallic oxide powders.

According to the embodiment, there is provided a light emitting device including a substrate comprising a transmissive material, a semiconductor structure layer disposed on the substrate and comprising a first conductive semiconductor layer, an active layer disposed on the first conductive semiconductor layer, and a second conductive semiconductor layer disposed on the active layer, a first electrode on the first conductive semiconductor layer, a second electrode disposed on the second conductive semiconductor layer, a transparent electrode layer between the second conductive semiconductor layer and the second electrode, and a plurality of lower refractive layers disposed on an outer surface of the semiconductor structure layer. Each of the lower refractive layers has a first open region in which the first electrode is disposed and a second open region in which the second electrode is disposed. The lower refractive layer includes a first lower refractive layer disposed on the semiconductor structure layer and a surface of the substrate and having a first refractive index lower than a refractive index of the semiconductor structure layer, a second lower refractive layer disposed on a surface of the first lower refractive layer and having a second refractive index lower than the first refractive index, the first refractive index of the first lower refractive layer is 1.7 or more, the second refractive index of the second lower refractive layer is 1.5 or less, and the second lower refractive layer comprises metallic oxide powers contained therein and a plurality of protrusions protruding out of the metallic oxide powers, respectively.

In the preceding description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device comprising:
a semiconductor structure layer having a first conductive semiconductor layer, a second conductive semiconductor layer, and an active layer between the first and second conductive semiconductor layers; and a plurality of lower refractive layers provided on an outer surface of the semiconductor structure layer, wherein the lower refractive layers include a first lower refractive layer having a first refractive index lower than a refractive index of the semiconductor structure layer on a surface of the semiconductor structure layer and a second lower refractive layer having a second refractive index lower than the first refractive index on an outer surface of the first lower refractive layer, wherein the second refractive index of the second lower refractive layer is 1.5 or less, wherein the second lower refractive layer is provided with a plurality of protrusions on an outer surface of the second lower refractive layer, wherein the second lower refractive layer includes a plurality of metallic oxide powders, wherein the outer surface of the semiconductor structure layer includes a plurality of lateral sides and a top surface of the semiconductor structure layer, wherein a sum of thicknesses of the plurality of lower refractive layers is less than a thickness of the semiconductor structure layer, and wherein the plurality of protrusions protrude outwardly on the outer surface of the second lower refractive layer, wherein each of the metallic oxide powders includes a material having a refractive index of 1.49 or less.

2. The light emitting device of claim 1, wherein the second lower refractive layer includes at least one of silicate, siloxane, hydrogen silsesquioxane (HSQ), methyl silsesquioxane (MQS), MQS+HSQ, perhydropolysilazane, or polysilazane.

3. The light emitting device of claim 1, wherein the first lower refractive layer includes at least one of a hafnium oxide, a zirconium oxide, or a magnesium oxide.

4. The light emitting device of claim 1, wherein the first refractive index is 2 or less, and the second refractive index has a difference of 0.01 or more from the first refractive index.

5. The light emitting device of claim 1, further comprising an electrode layer provided between the top surface of the semiconductor structure layer and the first lower refractive layer.

6. The light emitting device of claim 5, wherein the electrode layer includes a transmissive material.

7. The light emitting device of claim 5, further comprising a first electrode on a top portion of the first conductive semiconductor layer and a second electrode on the electrode layer, wherein at least one of the plurality of protrusions is provided on the top portion of the first conductive semiconductor layer, and wherein the first lower refractive layer and the first electrode physically contact an upper surface of the first conductive semiconductor layer.

8. The light emitting device of claim 7, wherein the first and second lower refractive layers are spaced apart from the first electrode.

9. The light emitting device of claim 1, further comprising a substrate including a transparent material under the semiconductor structure layer, wherein the second lower refractive layer extends on lateral sides of the substrate.

10. The light emitting device of claim 1, wherein each of the metallic oxide powders includes a silica material and has a width of 500 nm or more, and the second lower refractive layer has a thickness less than the width of one of the metallic oxide powders.

11. The light emitting device of claim 1, wherein each metallic oxide powder is spaced apart from the outer surface of the semiconductor structure layer, and has a width less than a width of each protrusion.

12. The light emitting device of claim 1, wherein the sum of thicknesses of the plurality of lower refractive layers is less than or equal to 1400 nm.

13. A light emitting device package comprising:
a body having a cavity;
a first lead electrode on a bottom surface of the cavity;
a second lead electrode on the bottom surface of the cavity;
the light emitting device of claim 1, wherein the light emitting device is in the cavity and is electrically connected to the first and second lead electrodes; and
a molding member around the light emitting device.

14. A light emitting device comprising:
a semiconductor structure layer having a first conductive semiconductor layer, a second conductive semiconductor layer, and an active layer between the first and second conductive semiconductor layers; and
a plurality of lower refractive layers provided on an outer surface of the semiconductor structure layer, wherein the lower refractive layers include a first lower refractive layer having a first refractive index lower than a refractive index of the semiconductor structure layer on a surface of the semiconductor structure layer and a second lower refractive layer having a second refractive index lower than the first refractive index on an outer surface of the first lower refractive layer, wherein the second refractive index of the second lower refractive layer is 1.5 or less, wherein the second lower refractive layer is provided with a plurality of protrusions on an outer surface of the second lower refractive layer, wherein the second lower refractive layer includes a plurality of metallic oxide powders, wherein the outer surface of the semiconductor structure layer includes a plurality of lateral sides and a top surface of the semiconductor structure layer, wherein a sum of thicknesses of the plurality of lower refractive layers is less than a thickness of the semiconductor structure layer, wherein the plurality of protrusions protrude outwardly on the outer surface of the second lower refractive layer, and wherein each of the metallic oxide powders contacts the outer surface of the first lower refractive layer.

15. The light emitting device of claim 14, wherein each of the metallic oxide powders includes a material having a refractive index of 1.49 or less.

* * * * *